(12) United States Patent
Yoon et al.

(10) Patent No.: US 11,292,884 B2
(45) Date of Patent: Apr. 5, 2022

(54) ORGANIC-INORGANIC-HYBRID THIN FILM AND METHOD OF MANUFACTURING THE SAME

(71) Applicant: UNID CO., LTD., Seoul (KR)

(72) Inventors: Chong Kwang Yoon, Seongnam-si (KR); Dong Shin Yun, Siheung-si (KR); Sang Min Kim, Uiwang-si (KR); Kyung Hoon Lee, Seongnam-si (KR)

(73) Assignee: UNID CO., LTD., Seoul (KR)

( * ) Notice: Subject to any disclaimer, the term of this patent is extended or adjusted under 35 U.S.C. 154(b) by 296 days.

(21) Appl. No.: 15/771,746

(22) PCT Filed: Mar. 29, 2016

(86) PCT No.: PCT/KR2016/003183
§ 371 (c)(1),
(2) Date: Apr. 27, 2018

(87) PCT Pub. No.: WO2017/164451
PCT Pub. Date: Sep. 28, 2017

(65) Prior Publication Data
US 2019/0010340 A1    Jan. 10, 2019

(30) Foreign Application Priority Data

Mar. 24, 2016    (KR) .......................... 10-2016-0035011

(51) Int. Cl.
*C09D 7/61* (2018.01)
*B32B 9/04* (2006.01)
(Continued)

(52) U.S. Cl.
CPC ................ *C08J 7/048* (2020.01); *B32B 9/00* (2013.01); *B32B 9/04* (2013.01); *C08F 292/00* (2013.01);
(Continued)

(58) Field of Classification Search
CPC ... C09D 7/00; C09D 4/00; C09D 7/40; C09D 7/61; C09D 7/62; C09D 7/66; C09D 7/67;
(Continued)

(56) References Cited

U.S. PATENT DOCUMENTS

| 2006/0147177 | A1* | 7/2006 | Jing ......................... | C08F 2/44 385/147 |
| 2007/0048513 | A1 | 3/2007 | Okamoto et al. | |
| 2011/0006386 | A1* | 1/2011 | Lee ........................... | C08F 2/44 257/432 |

FOREIGN PATENT DOCUMENTS

| JP | 02066172 | 3/1990 |
| JP | 2008527417 | 7/2008 |

(Continued)

OTHER PUBLICATIONS

Machine Translation of KR 10-2011-0062521 (Year: 2011).*
(Continued)

*Primary Examiner* — Sathavaram I Reddy
(74) *Attorney, Agent, or Firm* — Cantor Colburn LLP

(57) ABSTRACT

Provided is an organic-inorganic-hybrid thin film, which is provided in the form of a layered structure to prevent the scratching of the surface of a variety of kinds of displays, such as those of smartphones, tablet PCs, and laptop computers, and to fabricate ITO hard coating films, gas-barrier plates for flexible displays, and cover windows, and to a method of manufacturing the same, and more particularly, the organic-inorganic-hybrid thin film is provided in the form of a layered structure exhibiting the high light transmittance, mechanically flexible properties, lightweightness, and chemical resistance of a curable resin, and also ensuring the scratch resistance, heat dissipation performance, gas-barrier properties, and inherent refractive index matching of inorganic particles, thus exhibiting optical compensation (Continued)

effects, thereby increasing final surface hardness and satisfying barrier properties and index matching properties.

17 Claims, 4 Drawing Sheets

(51) Int. Cl.

| | |
|---|---|
| *H05K 1/03* | (2006.01) |
| *B32B 9/00* | (2006.01) |
| *C08F 292/00* | (2006.01) |
| *C08J 7/04* | (2020.01) |
| *G02B 1/18* | (2015.01) |
| *C09D 7/40* | (2018.01) |
| *C09D 7/62* | (2018.01) |
| *C09D 4/00* | (2006.01) |
| *C08F 2/50* | (2006.01) |
| *C08F 2/48* | (2006.01) |
| *B29C 59/16* | (2006.01) |
| *C08F 230/08* | (2006.01) |
| *H05K 5/00* | (2006.01) |
| *H05K 5/03* | (2006.01) |
| *H05K 7/20* | (2006.01) |
| *C08J 7/048* | (2020.01) |
| *C08J 7/043* | (2020.01) |
| *C08J 7/046* | (2020.01) |

(52) U.S. Cl.
CPC ............. *C08J 7/042* (2013.01); *C08J 7/043* (2020.01); *C08J 7/046* (2020.01); *C08J 7/0423* (2020.01); *C09D 4/00* (2013.01); *C09D 7/61* (2018.01); *C09D 7/62* (2018.01); *C09D 7/67* (2018.01); *C09D 7/68* (2018.01); *G02B 1/18* (2015.01); *H05K 1/03* (2013.01); *H05K 1/036* (2013.01); *B29C 59/16* (2013.01); *C08F 2/48* (2013.01); *C08F 2/50* (2013.01); *C08F 230/08* (2013.01); *C08J 2367/02* (2013.01); *C08J 2379/08* (2013.01); *C08J 2435/02* (2013.01); *C09D 7/40* (2018.01); *C09D 7/66* (2018.01); *H05K 1/0306* (2013.01); *H05K 1/0373* (2013.01); *H05K 5/0017* (2013.01); *H05K 5/03* (2013.01); *H05K 7/20963* (2013.01); *H05K 2201/0209* (2013.01); *H05K 2201/0257* (2013.01); *H05K 2201/0323* (2013.01)

(58) Field of Classification Search
CPC ... C09D 7/68; G02B 1/00; G02B 1/14; G02B 1/18; B29C 59/12; B32B 7/12; B32B 9/00; B32B 9/04; B32B 38/008; B32B 38/231; B32B 38/14; B32B 2457/08; B32B 2457/20; B32B 2605/08; C08F 2/48; C08F 2/50; C08F 230/08; C08F 292/00; C08J 7/042; C08J 7/0423; C08J 2367/02; C08J 2379/08; C08J 2435/02; H05K 1/03; H05K 1/0306; H05K 1/036; H05K 1/0373

See application file for complete search history.

(56) References Cited

FOREIGN PATENT DOCUMENTS

| | | |
|---|---|---|
| JP | 2014037453 | 2/2014 |
| KR | 20070103403 | 10/2007 |
| KR | 20080085791 | 9/2008 |
| KR | 20090126327 | 12/2009 |
| KR | 20110062521 A * | 6/2011 |
| KR | 20140011391 | 1/2014 |

OTHER PUBLICATIONS

Silica data sheet by Aqua Calc (Year: 2020).*
Data sheet for 3-(trimethoxysilyl)propyl (meth)acrylate (Year: 2020).*
International Search Report—PCT/KR2016/003183 dated Dec. 8, 2016.

* cited by examiner

ORGANIC-INORGANIC-HYBRID THIN FILM AND METHOD OF MANUFACTURING THE SAME

TECHNICAL FIELD

The present invention relates to an organic-inorganic-hybrid thin film, which is provided in the form of a layered structure to prevent scratching of the surface of a variety of kinds of displays, such as those of smartphones, tablet PCs, and laptop computers, and to fabricate ITO hard coating films, gas-barrier plates for flexible displays, and cover windows, and to a method of manufacturing the same. More particularly, the present invention relates to an organic-inorganic-hybrid thin film and a method of manufacturing the same, in which the organic-inorganic-hybrid thin film is provided in the form of a layered structure that ensures the high light transmittance, mechanically flexible properties, lightweightness, and chemical resistance of a UV-curable resin, in addition to the scratch resistance, heat dissipation performance, gas-barrier properties, and inherent refractive index matching of inorganic particles, thus exhibiting optical compensation effects, thereby increasing final surface hardness and satisfying barrier properties and index matching properties.

BACKGROUND ART

A conventional protective film makes it difficult to realize functionalities such as anti-glaring performance, fingerprint resistance, UV-blocking performance, antistatic properties, heat dissipation performance, and high dielectrics on a single substrate while simultaneously satisfying high transparency and scratch resistance. As for an ITO base film, in the case where ITO is directly deposited on a substrate without a buffer layer through a sputtering process, the ITO-deposited layer may be stripped or may be permanently deformed due to differences in the coefficient of thermal expansion and the refractive index between the ITO-deposited layer and the substrate. Furthermore, visibility may decrease due to mismatching of refractive indices. Also, a gas-barrier film is typically configured such that aluminum and a hard coating layer are deposited or applied and then laminated to decrease gas permeability. Such a film requires complicated processes such as deposition, coating and lamination, undesirably increasing the film cost. Hence, research into film compositions and manufacturing methods for simplifying such processes is urgently required.

In order to achieve the combined functionalities of a protective film, a multilayered film is formed without additional processing such as lamination, whereby the thickness of the film is decreased to thus improve the optical properties thereof. Furthermore, an ITO-deposited layer is formed using a coating composition alone without an additional buffer layer on the deposited surface of the ITO base film, thus decreasing mismatching of refractive indices and coefficients of thermal expansion between the ITO-deposited layer and the base film. Moreover, complicated manufacturing processes, including the deposition of inorganic particles and coating with an organic material on the gas-barrier film, may be simplified, whereby a manufacturing process such as a roll-to-roll continuous wet process may be performed, desirably increasing productivity and reducing manufacturing costs.

Also, electronic products including displays, such as smartphones, tablet PCs, PC monitors, LCDs and OLED TVs, protect the display device using chemically strengthened glass on the outermost surface of the display.

The term "chemically strengthened glass" means that glass is strengthened in a manner in which residual compressive stress is generated on the surface of glass by substituting $Na^+$ ions of alumino silicate ($Na_2O$—$Al_2O_3$—$SiO_2$), as an original glass component, with $K^+$ ions, having a large ionic radius, using a $KNO_3$ solution or composition.

Such strengthened glass is relatively high in compressive strength, bending strength and impact resistance, but is heavy and is easily broken due to external impact and thermal shock. Since glass has very low elastic strain, it cannot be applied to flexible displays, and thus there is an urgent need to develop replacements for strengthened glass.

DISCLOSURE

Technical Problem

Accordingly, the present invention has been made keeping in mind the above problems encountered in the related art, and the present invention is intended to provide an organic-inorganic-hybrid thin film having a layered structure and a method of manufacturing the same, in which the resulting film is not fragile, is highly flexible and may be applied to flexible displays; has superior dielectric constant and heat dissipation effects compared to conventional glass, and is lightweight, to thus enable weight reduction; is thin, and enables the combination of functionalities such as fingerprint resistance and UV-blocking performance to thus prevent scratching of the surface of a display; relieves inner stress due to the deposition of an oxide layer such as ITO, and alleviates mismatching of refractive indices; and facilitates a cutting process to thus be capable of being manufactured through a roll-to-roll continuous process.

In addition, the present invention is intended to provide a film having high barrier properties for external moisture and oxygen using surface-modified nanomaterial particles having gas-barrier properties, even without the deposition of an inorganic material such as a metal via sputtering.

In addition, the present invention is intended to provide an organic-inorganic-hybrid thin film having a layered structure and a method of manufacturing the same, in which such a film may be applied to cover windows of displays of various electronic products, protective plates, flexible boards, glass for buildings, bulletproof glass, or low-dielectric-constant insulating layers for PCBs.

Technical Solution

The present invention provides an organic-inorganic-hybrid thin film having a layered structure.

As shown in FIGS. 1A, 1B and 2, the organic-inorganic-hybrid thin film comprises a substrate having an upper surface and a lower surface, a coating layer for an organic/inorganic layer applied on at least one surface selected from among the upper surface and the lower surface of the substrate and composed of nanomaterial particles or surface-modified nanomaterial particles, and an adhesive layer formed on the surface of the coating layer opposite the surface applied on the substrate.

The thin film, configured such that the substrate and the organic/inorganic layer are bonded to each other, has high surface hardness, and thus the surface thereof may be prevented from becoming scratched after long-term use. Also, the thin film is very flexible and may thus be easily applied to flexible displays, and is not fragile, is lightweight, and may be easily cut. In addition thereto, properties related to a low dielectric constant, high heat dissipation performance, gas-barrier properties, and alleviation of mismatching of stress and refractive indices between the deposited layer and the substrate may be further imparted.

The composition for the coating layer of the present invention includes a UV-curable resin, and polymerization of an organic material is promoted by the action of the photoinitiator upon irradiation with UV light. Here, useful is a monomer having a polymerizable functional group, an oligomer or a polymer.

Examples of the functional group of the UV-curable resin may include, as shown in FIGS. 3 and 4, an acrylic group, a urethane group, a vinyl group, an allyl group, etc. In particular, a functional group having an unsaturated double bond, such as acrylate, or having a reactive substituent, such as an epoxy group or a silanol group, may be used.

The composition for the coating layer includes a multifunctional acrylate monomer, whereby the inorganic particles thereof are well dispersed in an organic medium so as to prevent the aggregation and precipitation of the inorganic particles, and the monomer or oligomer inorganic material may be uniformly mixed, thus yielding a hard coating composition having superior optical properties and surface hardness.

Specifically, the multifunctional acrylate monomer may include, but is not necessarily limited to, at least one selected from the group consisting of 1,4-butanediol di(meth)acrylate, neopentyl glycol di(meth)acrylate, hydroxyl pivalic acid neopentyl glycol di(meth)acrylate, dicyclopentanyl di(meth)acrylate, caprolactone-modified dicyclopentenyl di(meth)acrylate, ethyleneoxide-modified hexahydrophthalic acid di(meth)acrylate, allylated cyclohexyl di(meth)acrylate, ethylene glycol di(meth)acrylate, 1,6-hexanediol diacrylate, trimethylolpropane tri(meth)acrylate, pentaerythritol tri(meth)acrylate, dipentaerythritol penta(meth)acrylate, dipentaerythritol hexa(meth)acrylate, polyol-poly(meth)acrylate, bisphenol A diglycidyl ether di(meth)acrylate, urethane (meth)acrylate, and glycidyl methacrylate. These UV-curable resins may be used alone or in combination.

Preferably, pentaerythritol triacrylate (PETA), dipentaerythritol pentaacrylate (DPPA), dipentaerythritol hexaacrylate (DPHA) and trimethylol propane triacrylate (TMPTA) are used as the multifunctional acrylate monomer, thus significantly increasing the pencil hardness of the film and also increasing the UV curability thereof.

The composition for the coating layer of the present invention comprises a multifunctional acrylate monomer, oligomer and alumina, and specifically 50.0 to 70.0 wt % of a hexafunctional monomer, 15.0 to 30.0 wt % of a trifunctional or tetrafunctional monomer, and 15.0 to 30.0 wt % of an acrylate oligomer.

The amount of the inorganic particles is preferably 14.0 to 50.0 wt %. If the amount thereof is less than 14 wt %, the effect of increasing hardness is insignificant. On the other hand, if the amount thereof exceeds 50 wt %, the haze of the hard coating film is increased, making it impossible to obtain desired optical properties. Furthermore, the curability of the surface-modified nanomaterial coating layer is decreased, thus remarkably deteriorating the adhesion between the substrate and the surface-modified nanomaterial coating layer, which is undesirable.

The solvent used for the surface-modified inorganic coating composition may include at least one selected from the group consisting of alcohols, such as methanol, ethanol, propanol and isopropanol, ketones, such as methyl ethyl ketone and methyl isobutyl ketone, esters, such as methyl acetate and ethyl acetate, aromatic compounds, such as toluene, benzene and xylene, and ethers. Preferably useful is a ketone-based organic solvent. The use of an alcohol or ketone solvent enables uniform application on the surface of the substrate, and may prevent the formation of defects such as open pores in the surface of the coating layer even after the coating process, thus making it easier to obtain a coating layer having superior optical properties. However, the present invention is not necessarily limited thereto.

The amount of the solvent is set such that an appropriate viscosity may result so as to facilitate the coating process, and the solvents may be used alone or in combination. Preferably, the solvent is used in an amount of 20 to 80 wt % based on the amount of the surface-treated nanomaterial coating composition. More preferably, the amount thereof is set within the range of 30 to 60 wt %, in order to increase adhesion to the substrate and bonding to the organic binder.

In order to initiate the polymerization of the surface-modified nanomaterial composition, the use of a photoinitiator is preferable. Examples of the photoinitiator may include, but are not particularly limited to, acetophenone, benzophenone, ketal, anthraquinone, a disulfide compound, a thiuram compound, and a fluoroamine compound. A specific example of the photoinitiator may include at least one selected from the group consisting of 1-hydroxy-cyclohexyl-phenol-ketone, 2-methyl-1[4-(methylthio)phenyl]-2-morpholinopropan-1-one, benzyl dimethyl ketone, 1-(4-dodecylphenyl)-2-hydroxy-2-methylpropan-1-one, 2-hydroxy-2-methyl-1-phenylpropan-1-one, 1-(4-isopropylphenyl)-2-hydroxy-2-methylpropan-1-one, benzophenone, 2,2-dimethoxy-2-phenylacetophenone, 2,2-diethoxy-2-phenylacetophenone, 2-hydroxy-2-methyl-1-propan-1-one, 4,4'-diethylaminobenzophenone, dichlorobenzophenone, 2-methylanthraquinone, 2-ethylanthraquinone, 2-methylthioxantone, 2-ethylthioxantone, 2,4-dimethylthioxantone, and 2,4-diethylthioxantone. Such initiators may be used alone or in combination.

The photoinitiator includes at least one selected from among the aforementioned compounds, and the amount thereof is 0.1 to 5.0 wt %, and preferably 0.5 to 2 wt, and thus, the effect of minimizing defects in the coating layer may be further expected.

The surface-modified nanoparticle composition may appropriately contain at least one additive selected from among a UV blocker, an antistatic agent, a lubricant, a leveler, an antifoaming agent, a polymerization promoter, a surfactant, and a surface modifier. Among these additives, when a reactivity-modified fluorine compound is added, fingerprint resistance and antifouling effects may be imparted to the surface-modified nanomaterial coating layer.

The amount of the additive is preferably set within the range of 0.1 to 10.0 wt % based on the surface-modified nanomaterial coating composition. If the amount thereof is less than 0.1 wt %, the effect of imparting fingerprint resistance or antifouling performance is insignificant. On the other hand, if the amount thereof exceeds 10 wt %, the hardness of the surface-modified nanomaterial coating layer may decrease, making it difficult to increase pencil hardness of the hard coating layer, and the optical properties may deteriorate. More preferably, the amount thereof falls in the range of 1 to 5 wt %.

The nanomaterial particles used for the composition for the coating layer of the present invention may include at least one selected from among metal oxides such as $Al_2O_3$, $ZnO$, $TiO_2$ and $SiO_2$, metal compounds, carbon-based materials such as graphene and carbon nanotube (CNT), and metal materials, and specific examples thereof may include alumina (alpha, gamma, eta, and theta), titania (rutile, rutile/anatase-mixed crystal, and anatase amorphous structure), zirconia, silica, indium oxide, tin oxide, zinc oxide, and mixtures thereof. Preferably useful is alumina, silica, or titania.

The surface-modified nanomaterial particles may be composed of at least one selected from among metal oxides including $Al_2O_3$, $ZnO$, $TiO_2$ and $SiO_2$, metal compounds, carbon-based materials including graphene and CNT, and metal materials, all of which are surface-modified.

When metal nanoparticles are added to the hard coating composition, conductivity may be imparted depending on the amount of metal nanoparticles that are added.

When metal nanowires are added, a conductive network may be formed within the film after the curing process, and thus the film may be imparted with conductivity and simultaneously with mechanically flexible properties. Due to the features of the nanowire shape, the surface resistance of the conductive film may be remarkably decreased compared to when using the nanoparticles.

When metal oxide-based alumina is added, the thermal conductivity of the hard coating film is increased thanks to the high thermal conductivity of alumina, and such nanoparticles act as a reinforcing agent, thus increasing surface hardness.

When titania or zirconia is added, the thickness of a high-refractive-index layer may be decreased by virtue of the high refractive properties of such particles.

When silica is added, optical transparency may be realized, and hardness may be increased. When hollow silica is used, heat insulation effects and low dielectric constant may be imparted due to the pores formed in such nanoparticles.

When indium oxide or tin oxide is added in a predetermined amount or more, mismatching of coefficients of thermal expansion and refractive indices upon ITO deposition may be alleviated, whereby the stress between the ITO-deposited layer and the substrate may be relieved, thus preventing permanent defects of the film.

When CNT is added, surface resistance is decreased and thus electrical properties are improved, and also, gas-barrier properties are increased and the gas-barrier performance for moisture and oxygen may be improved.

When graphene is added, electrical properties are not changed in the case where the film is extended or bended, thus exhibiting mechanically flexible properties and high electrical and optical properties.

When diamond is added, transparency is obtained in the visible light and near infrared ranges due to the wide band gap (~5 eV) of diamond, and the film hardness may be increased.

The aforementioned nanomaterials have low dispersion stability when not surface-modified, and thus, the inherent properties thereof are not exhibited, attributable to the aggregation of such particles. Also, reactivity between the particles and the organic medium may vary depending on the surface functional group of the particles.

Preferably, when a functional group, such as acryl, vinyl or epoxy, is introduced to the surface of the particles, the dispersion stability of the particles is increased due to the steric repulsion effects, and curability is increased due to external heat or light irradiation by virtue of the bonding between the particles and the organic medium, resulting in increased film hardness.

Such inorganic particles may be used in various forms such as powder and solution phases (sol or gel), and have an average particle size of about 10 to 100 nm and a spherical shape, which impedes aggregation.

If the particle size exceeds 100 nm, the prepared hard coating film becomes optically opaque because the haze thereof is increased, and also, the extent of increasing pencil hardness is decreased. The inorganic particles are most preferably provided in the form of a sol, which may be prepared through methods well-known in the art, and any commercially available sol that is dispersed in various kinds of solvents may be used, or any sol may be used so long as it may be uniformly dispersed in the hard coating composition.

The amount of the surface-treating agent contained in the surface-modified nanomaterial particles of the present invention is 0.1 to 100 wt %, preferably 5 to 40 wt %, and more preferably 10 to 20 wt %, based on the nanomaterial particles.

The surface-treating agent may include, but is not limited to, at least one selected from the group consisting of 3-(trimethoxysilyl)propyl vinyl carbamate, 3-(trimethoxysilyl)propyl acrylate, 3-(trimethoxysilyl)propyl methacrylate, trimethylsilyl acrylate, 3-(2,3-epoxypropoxy)propyl trimethoxysilane, 3-(2,3-epoxypropyloxy)propyl triethoxysilane, zinc acrylate, zirconium acrylate, zirconium carboxyethyl acrylate, hafnium carboxyethyl acrylate, and 2-(dimethylamino)ethyl acrylate. In addition thereto, any known surface-treating agent may be used.

The catalyst contained in the surface-modified nanomaterial particles of the present invention may include hydrochloric acid, nitric acid, sulfuric acid, ammonia, potassium hydroxide, and sodium hydroxide. In addition to the above acid-base catalyst, any acid-base catalyst may be used so long as it is typically known to be useful in the preparation of surface-modified inorganic particles.

The solvent contained in the preparation of the surface-modified nanomaterial according to the present invention may include alcohols (isopropanol, ethanol, and ethyleneglycol), methylene chloride, ketones (methyl ethyl ketone, methyl isobutyl ketone, etc.), and ethers (propylene glycol monomethyl ether, tetrahydrofuran, ethylene glycol dimethylether), which may be used alone or in combination. Preferably useful is a mixture of alcohol and methylene chloride.

The surface-modified nanomaterial particles in the surface-modified nanomaterial coating layer may be bonded to each other by means of any one selected from among oxygen (O), inorganic particles or carbon (C). Here, the nanomaterial particles may be the same type of inorganic particles as the nanoparticles of the surface-modified nanomaterial coating layer. In this case, properties such as insulating properties, reflectance, transparency, etc. are improved.

Also, a primer coating layer may be further provided between the substrate and the surface-modified nanomaterial coating layer. Such a primer coating layer may be formed of an adhesive material such as a thermosetting acrylic resin, a thermosetting epoxy resin, a thermosetting urethane resin, and a UV-curable resin. The substrate may include at least one selected from the group consisting of an optical film, a polymer film, a silicon wafer, a sapphire wafer, a printed circuit board, and a metal board.

The substrate may have a thickness ranging from 10 nm to 1 mm, and preferably from 1 µm to 500 µm.

The layered structure, configured such that the surface-modified nanomaterial film is formed on the surface of the substrate, is manufactured by providing a substrate having an upper surface and a lower surface, preparing a surface-modified nanomaterial coating layer including surface-modified nanomaterial particles, and coating at least one surface selected from among the upper surface and the lower surface of the substrate with the surface-modified nanomaterial coating layer including the inorganic particles.

Furthermore, applying an adhesive on at least one surface selected from among the upper surface and the lower surface of the substrate may be further performed, before coating with the surface-modified nanomaterial coating layer.

As shown in FIG. 5, flattening the upper surface of the surface-modified nanomaterial coating layer using etching or plasma cleaning may be further performed, after coating with the surface-modified nanomaterial coating layer. In this case, the light transmittance of the film is maximized, the haze thereof is also decreased, and the thermal conductivity is increased.

Alternatively, it is possible to coat both of the upper and lower surfaces of the substrate with the surface-modified nanomaterial coating layer, and a film configured such that the substrate and the surface-modified nanomaterial coating layer are sequentially stacked multiple times may result. As illustrated in FIGS. 7A and 7B, the resulting thin film may be applied to a flexible cover window, a flexible substrate, or a PCB.

As illustrated in FIG. 5, the surface of the coating layer is preferably trimmed so as to improve the surface strength and roughness thereof.

As illustrated in FIG. 6, two or more surface-modified nanomaterial coating layers may be formed on the upper surface (or the upper and lower surfaces) of the substrate. Here, two or more surface-modified nanomaterial coating layers may be formed using two or more selected from among the aforementioned materials. As such, the use of different surface-modified nanomaterials is preferable. The adhesive layer 30 may further include a UV blocker.

As illustrated in FIGS. 7A and 7B, organic and inorganic layers may be provided to overlap each other in the form of a sandwich.

The coating layer may have a film thickness ranging from 1 nm to 300 μm after the curing process.

The nanomaterial particles or the surface-modified nanomaterial particles of the coating layer may have a particle size ranging from 1 nm to 200 nm, which is more specifically described in the following Examples.

The present invention addresses a functional thin film configured such that a substrate therefor is coated with a surface-modified nanomaterial coating layer resulting from the surface-modified nanomaterial coating composition.

Advantageous Effects

According to the present invention, the film resulting from the surface-modified nanomaterial coating composition is thin and has combined functionalities, thus preventing scratching of the surface thereof. Furthermore, it can exhibit high flexibility and can thus be applied to flexible displays, and has dielectric constant and heat dissipation effects superior to those of conventional films, facilitates the cutting process, can be obtained through a roll-to-roll continuous process, and can be applied to cover windows of various displays, cover windows of flexible displays, ITO base films, gas-barrier films, flexible boards, various protective films, and low-dielectric-constant insulating layers for PCBs.

Figure 1A:
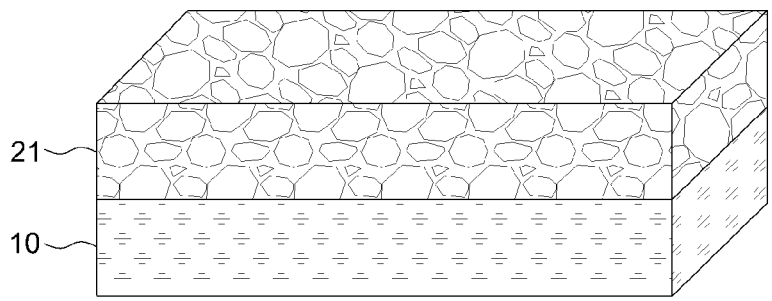
FIGS. 1A and 1B are a perspective view showing an organic-inorganic-hybrid thin film according to an embodiment of the present invention.
Figure 1B:
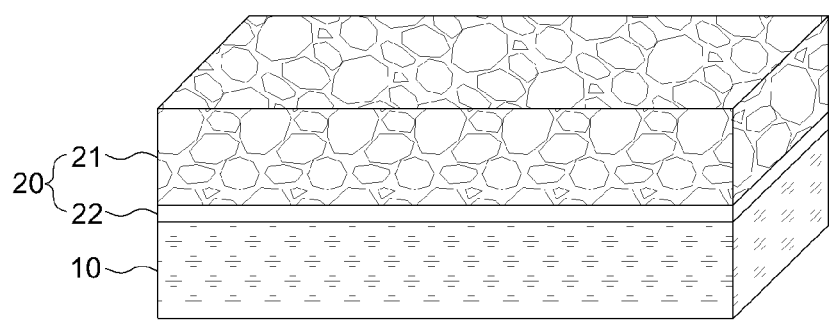
Figure 2:
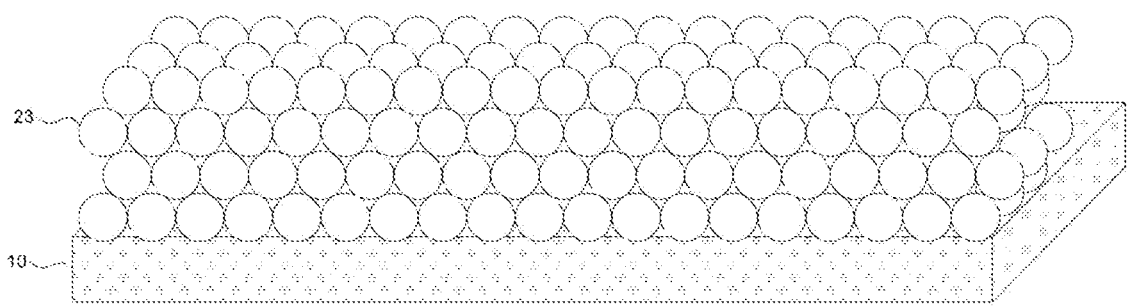
FIG. 2 shows the structure of the organic-inorganic-hybrid thin film according to the present invention.
Figure 3:
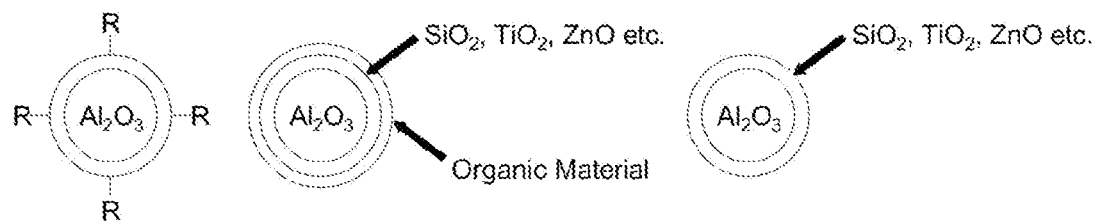
FIG. 3 shows the candidates for a surface-treating agent for nanoparticles according to the present invention.
Figure 4:
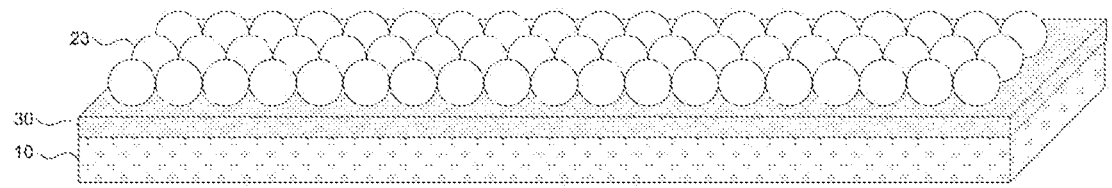
FIG. 4 shows the structure in which an adhesive layer is coated with alumina.
Figure 5:
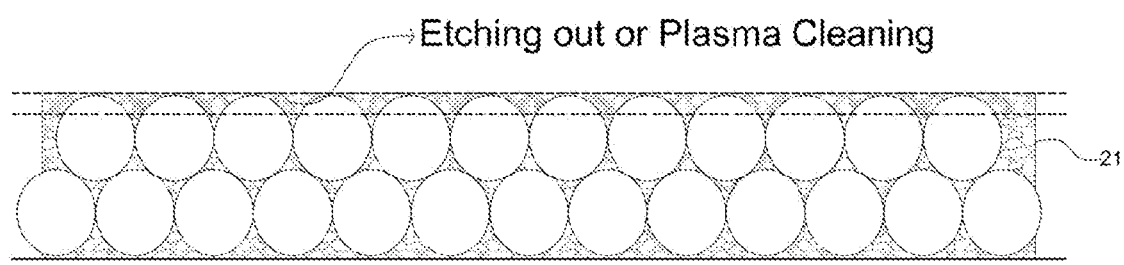
FIG. 5 shows an improvement in the roughness of the organic-inorganic-hybrid thin film according to the present invention.
Figure 6:
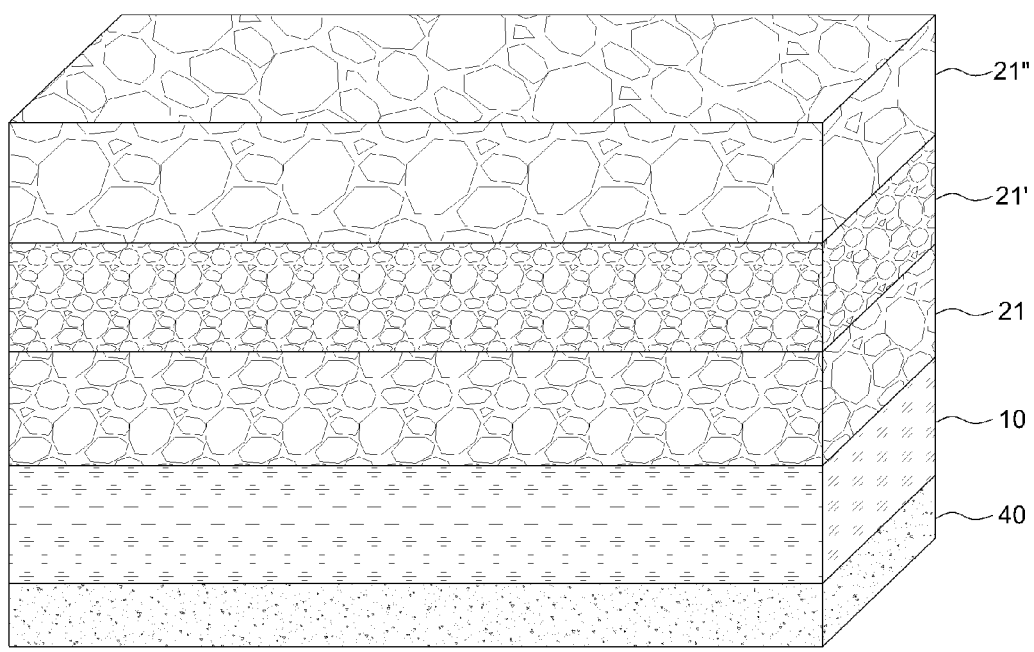
FIG. 6 shows an organic-inorganic-hybrid thin film according to a modified embodiment of the present invention.
Figure 7A:
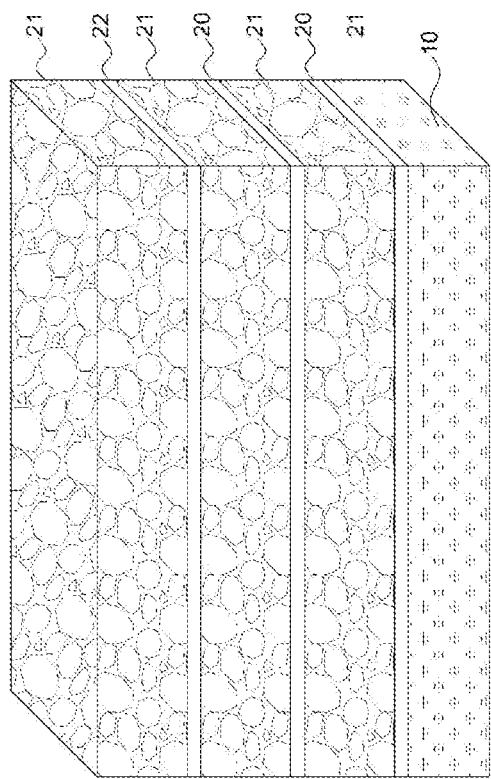
FIGS. 7A and 7B show an organic-inorganic-hybrid thin film according to another modified embodiment of the present invention.
Figure 7B:
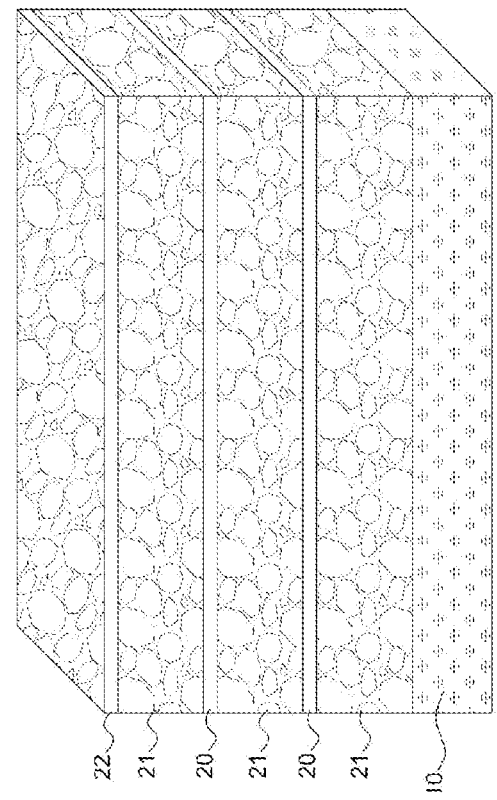

<Description of the Reference Numerals in the Drawings>

10: substrate
21: first organic/inorganic layer
21': second organic/inorganic layer
21'': third organic/inorganic layer
23: inorganic layer or surface-modified inorganic layer
30: adhesive layer
40: adhesive layer or UV-blocking layer 20: coating layer 22: organic layer

BEST MODE

Hereinafter, a detailed description will be given of an organic-inorganic-hybrid thin film having a layered structure and a method of manufacturing the same according to embodiments of the present invention.

For a surface-modified alumina coating layer, alumina ($Al_2O_3$) particles were prepared in Preparation Example. As the amount of $NH_4OH$ that was added was changed, two kinds of alumina particles having different particle diameters were obtained.

Preparation Example 1. (Preparation of $Al_2O_3$)

100 ml of anhydrous ethanol ($C_2H_5OH$) was placed in a 250 ml three-neck flask, after which 2.5 g of AIP (Aluminum Isopropoxide, $Al[OCH(CH_3)_2]$) was added, and the reaction mixture was stirred at room temperature for 3 hr at 400 rpm using a mechanical stirrer, thus preparing a 0.12 M AIP solution. Into the 0.12 M AIP solution, which was stirred at 400 rpm using a mechanical stirrer, 0.52 ml of 0.07 to 0.21 M $NH_4OH$ was added dropwise, and the reaction was carried out at room temperature for 4 hr. The powder thus synthesized was filtered, washed, dried and then thermally treated, thereby yielding alumina particles having a particle size ranging from 20 to 60 nm.

As shown in Table 1 below, inorganic particles were prepared depending on the kind of precursor thereof, and alumina particles having a particle size of about 20 nm were confirmed at different ammonia concentrations.

TABLE 1

Properties of inorganic particles depending on the kind of precursor

| No. | Precursor | Ammonia concentration (M) | Particle size (nm) |
| --- | --- | --- | --- |
| 1-1 | Aluminum isopropoxide (AIP) | 0.07 | 60 |
| 1-2 | | 0.14 | 40 |

TABLE 1-continued

Properties of inorganic particles depending on the kind of precursor

| No. | Precursor | Ammonia concentration (M) | Particle size (nm) |
|---|---|---|---|
| 1-3 | | 0.21 | 20 |
| 1-4 | TEOS | 0.07 | 50 |
| 1-5 | | 0.14 | 35 |
| 1-6 | | 0.21 | 25 |
| 1-7 | Titanium (IV) isopropoxide (TTIP) | 0.21 | 20 |
| 1-8 | Tetraethyl orthotitanate (TEOT) | 0.21 | 20 |

Preparation Example 2. (Preparation of Inorganic Particle Dispersion)

Inorganic particle dispersions were prepared by milling the inorganic particles of Preparation Example 1 for 5 hr. Here, the dispersion solvent was an alcoholic organic solvent such as isopropyl alcohol, and the dispersions shown in Table 2 below were obtained.

TABLE 2

Preparation of inorganic particle dispersion

| No. | Inorganic particles | Average particle size (nm) |
|---|---|---|
| 2-1 | 1-1 | 80 |
| 2-2 | 1-2 | 55 |
| 2-3 | 1-3 | 40 |
| 2-4 | 1-4 | 70 |
| 2-5 | 1-5 | 50 |
| 2-6 | 1-6 | 40 |
| 2-7 | 1-7 | 33 |
| 2-8 | 1-8 | 38 |

Preparation Example 3. (Preparation of Surface-Modified Inorganic Particles and Dispersion)

Each of the inorganic particle dispersions of Preparation Example 2 was added with a surface-treating agent, as shown in Table 3 below, and reacted at room temperature for 3 hr. A dispersant made by BYK was added in an amount of 10% based on the amount of the surface-modified inorganic particles, followed by milling using a nanomill for 5 hr, thus obtaining 30% surface-modified nanomaterial dispersions as shown in Table 3 below.

TABLE 3

Conditions of Preparation Example 3 and average particle size in dispersion

| Preparation Example No. | Dispersion | Surface-treating agent | Average particle size (nm) in dispersion |
|---|---|---|---|
| 3-1 | 2-3 | 3-(Trimethoxysilyl)propyl vinyl carbamate | 40 |
| 3-2 | 2-5 | 3-(Trimethoxysilyl)propyl vinyl carbamate | 50 |
| 3-3 | 2-6 | 3-(Trimethoxysilyl)propyl vinyl carbamate | 40 |
| 3-4 | 2-7 | 3-(Trimethoxysilyl)propyl vinyl carbamate | 33 |
| 3-5 | 2-8 | 3-(Trimethoxysilyl)propyl vinyl carbamate | 38 |
| 3-6 | 2-3 | 3-(Trimethoxysilyl)propyl acrylate | 40 |
| 3-7 | 2-6 | 3-(Trimethoxysilyl)propyl acrylate | 40 |
| 3-8 | 2-8 | 3-(Trimethoxysilyl)propyl acrylate | 38 |
| 3-9 | 2-3 | 3-(Trimethoxysilyl)propyl methacrylate | 40 |
| 3-10 | 2-6 | 3-(Trimethoxysilyl)propyl methacrylate | 40 |
| 3-11 | 2-8 | 3-(Trimethoxysilyl)propyl methacrylate | 38 |
| 3-12 | 2-3 | 3-(2,3-Epoxypropyloxy)propyl triethoxysilane | 40 |
| 3-13 | 2-6 | 3-(2,3-Epoxypropyloxy)propyl triethoxysilane | 40 |
| 3-14 | 2-8 | 3-(2,3-Epoxypropyloxy)propyl triethoxysilane | 38 |

The properties of the surface-modified nanomaterial inorganic particle thin films according to the present invention were as follows.

1) Light Transmittance and Haze

Total transmittance and haze were measured using a spectrophotometer (made by Nippon Denshoku, Japan, NDH700).

2) Reflectance

Reflectance was measured using a color measurement system (CM-5).

3) Pencil Hardness

Pencil hardness was measured under a load of 750 g using a pencil hardness tester according to ASTM D3502.

4) Adhesion

Onto a 5 mm thick glass board having a piece of double-sided tape attached thereto, the nanomaterial inorganic particle thin film of each of the Examples and Comparative Examples was adhered such that the coating layer thereof was positioned outwards. Subsequently, lattice pattern cuts forming 100 squares were made in the thin film ranging from the coating layer to the substrate using a cutter guide having a gap interval of 2 mm. Then, a piece of adhesive tape (made by Nichiban, No. 405; width 24 mm) was attached to the surface of the lattice pattern cuts. The air remaining at the interface upon attachment was completely removed using an eraser and thus the adhesive tape was completely adhered, after which the adhesive tape was forcibly vertically detached, and the adhesion was observed with the naked eye based on the following Equation. Also, the case of a square having partial detachment was combined to count the number of detached squares.

Adhesion (%)=(1−number of detached squares/100)× 100

⊚: Adhesion (%) of 90 to 100%
◯: Adhesion (%) of 80 to 89%
x: Adhesion (%) of 0 to 79%

Example 1

In the coating layer of the surface-modified inorganic particles of Preparation Example 3-1 having a solid content of 50 wt %, an organic binder having a solid content of 50 wt % (the organic binder includes an oligomer, a hexafunctional monomer, and a tetrafunctional monomer) was used and 2,2-dimethoxy-1,2-diphenyl ethanone as a photoinitiator was added in an amount of 1 wt %, thus preparing a coating composition for a 30% surface-modified nanomaterial inorganic particle thin film, as shown in Table 4 below.

The coating composition was applied on a PET film, dried at 50° C., and cured with UV light in air using a high-pressure mercury lamp (0.5 J/cm$^2$), thereby manufacturing a surface-modified nanomaterial inorganic particle thin film as shown in Table 4 below.

Examples 2 to 14

Respective thin films as shown in Table 4 below were manufactured in the same manner as in Example 1, with the exception that Preparation Examples 3-2 to 3-14 of Table 3 were used.

Comparative Examples 1 to 8

Respective thin films as shown in Table 4 below were manufactured in the same manner as in Example 1, with the exception that the nanomaterial particle dispersion of Preparation Example 2 was used.

TABLE 4

|  | Coating thick. (μm) | Light transmittance (%) | Haze | Reflectance (%) | Pencil hardness (H) | Adhesion | Thermal conductivity (W/mK) |
|---|---|---|---|---|---|---|---|
| Ex. 1 | 8.4 | 91 | 1.2 | 0.91 | 9 | ◎ | 8.3 |
| Ex. 2 | 8.7 | 92 | 1.3 | 0.87 | 8 | ◎ | 8.4 |
| Ex. 3 | 8.6 | 93 | 1.2 | 0.84 | 8 | ◎ | 8.9 |
| Ex. 4 | 8.5 | 94 | 1.2 | 0.82 | 8 | ◎ | 9.1 |
| Ex. 5 | 8.9 | 93 | 1.3 | 0.93 | 9 | ◎ | 9.0 |
| Ex. 6 | 9.1 | 93 | 1.1 | 0.94 | 9 | ◎ | 8.7 |
| Ex. 7 | 9.2 | 91 | 1.2 | 0.84 | 8 | ◎ | 8.6 |
| Ex. 8 | 7.8 | 93 | 1.0 | 0.83 | 9 | ◎ | 8.5 |
| Ex. 9 | 7.9 | 92 | 0.9 | 0.86 | 9 | ◎ | 8.4 |
| Ex. 10 | 8.4 | 93 | 1.2 | 0.87 | 8 | ◎ | 8.2 |
| Ex. 11 | 8.6 | 94 | 1.1 | 0.91 | 8 | ◎ | 8.9 |
| Ex. 12 | 8.9 | 93 | 1.0 | 1.01 | 9 | ◎ | 9.0 |
| Ex. 13 | 9.1 | 93 | 1.3 | 0.98 | 8 | ◎ | 9.1 |
| Ex. 14 | 9.2 | 92 | 1.0 | 0.92 | 9 | ◎ | 9.0 |
| C. Ex. 1 | 10 | 87 | 3.4 | 3.0 | 6 | ◎ | 3.5 |
| C. Ex. 2 | 12 | 89 | 3.2 | 3.2 | 5 | ○ | 5.0 |
| C. Ex. 3 | 13 | 88 | 3.1 | 3.4 | 4 | ○ | 5.4 |
| C. Ex. 4 | 11 | 87 | 3.0 | 3.5 | 4 | ○ | 5.8 |
| C. Ex. 5 | 12 | 87 | 2.9 | 3.1 | 6 | ○ | 6.0 |
| C. Ex. 6 | 13 | 88 | 2.7 | 2.9 | 5 | ○ | 7.1 |
| C. Ex. 7 | 11 | 87 | 3.2 | 2.8 | 4 | ○ | 4.8 |
| C. Ex. 8 | 10 | 85 | 4.0 | 4.1 | 5 | ○ | 3.9 |

Examples 15 to 28

Respective thin films as shown in Table 5 below were manufactured in the same manner as in Examples 1 to 14, with the exception that the transparent PI film was used.

Comparative Examples 9 to 16

Respective thin films as shown in Table 5 below were manufactured in the same manner as in Comparative Examples 1 to 8, with the exception that the transparent PI film was used.

TABLE 5

|  | Coating thick. (μm) | Light transmittance (%) | Haze | Reflectance (%) | Pencil hardness (H) | Adhesion | Thermal conductivity (W/mK) |
|---|---|---|---|---|---|---|---|
| Ex. 15 | 7.1 | 91.5 | 1.1 | 0.93 | 9 | ◎ | 8.6 |
| Ex. 16 | 6.8 | 91.3 | 1.2 | 0.82 | 9 | ◎ | 8.5 |
| Ex. 17 | 6.7 | 92.1 | 1.2 | 0.81 | 9 | ◎ | 8.7 |
| Ex. 18 | 6.1 | 93.4 | 1.1 | 0.80 | 9 | ◎ | 9.2 |
| Ex. 19 | 6.8 | 92.1 | 1.2 | 0.92 | 9 | ◎ | 9.3 |
| Ex. 20 | 6.3 | 92.5 | 1.0 | 0.91 | 9 | ◎ | 8.4 |
| Ex. 21 | 6.4 | 92.4 | 1.1 | 0.81 | 9 | ◎ | 8.6 |
| Ex. 22 | 6.5 | 92.9 | 1.0 | 0.82 | 9 | ◎ | 8.7 |
| Ex. 23 | 6.2 | 92.3 | 0.8 | 0.81 | 9 | ◎ | 8.8 |
| Ex. 24 | 5.1 | 93.1 | 1.1 | 0.81 | 9 | ◎ | 8.3 |
| Ex. 25 | 8.0 | 92.5 | 1.1 | 0.90 | 9 | ◎ | 8.6 |
| Ex. 26 | 7.5 | 93.2 | 1.0 | 1.00 | 9 | ◎ | 9.2 |
| Ex. 27 | 7.6 | 92.8 | 1.2 | 0.91 | 9 | ◎ | 9.3 |
| Ex. 28 | 6.8 | 93.2 | 1.2 | 0.94 | 9 | ◎ | 9.1 |
| C. Ex. 9 | 9.4 | 89.6 | 3.8 | 3.2 | 7 | ◎ | 3.2 |

TABLE 5-continued

|  | Coating thick. (μm) | Light transmittance (%) | Haze | Reflectance (%) | Pencil hardness (H) | Adhesion | Thermal conductivity (W/mK) |
|---|---|---|---|---|---|---|---|
| C. Ex. 10 | 9.8 | 89.2 | 3.6 | 3.6 | 6 | ○ | 4.5 |
| C. Ex. 11 | 10.1 | 88.4 | 3.8 | 3.5 | 6 | ○ | 4.6 |
| C. Ex. 12 | 9.5 | 87.3 | 3.7 | 3.4 | 5 | ○ | 5.1 |
| C. Ex. 13 | 9.6 | 87.4 | 2.2 | 3.7 | 7 | ○ | 5.2 |
| C. Ex. 14 | 9.8 | 88.2 | 2.3 | 2.8 | 5 | ○ | 6.2 |
| C. Ex. 15 | 9.7 | 87.4 | 3.4 | 2.9 | 5 | ○ | 4.2 |
| C. Ex. 16 | 9.5 | 85.6 | 4.5 | 4.5 | 6 | ○ | 3.2 |

Example 29

In the coating layer of the surface-modified inorganic particles of Preparation Example 3-1 having a solid content of 14 wt %, an organic binder having a solid content of 86 wt % (the organic binder includes an oligomer, a hexafunctional monomer, and a tetrafunctional monomer) was used and 2,2-dimethoxy-1,2-diphenyl ethanone as a photoinitiator was added in an amount of 1 wt %, thus obtaining a coating composition for a 30% surface-modified nanomaterial inorganic particle thin film.

The coating composition was applied on a transparent PI film, dried at 50° C., and cured with UV light in air using a high-pressure mercury lamp (0.5 J/cm$^2$), thereby manufacturing a surface-modified nanomaterial inorganic particle thin film as shown in Table 6 below.

Examples 30 to 42

Respective thin films as shown in Table 6 below were manufactured in the same manner as in Example 29, with the exception that Preparation Examples 3-2 to 3-14 of Table 3 were used.

Comparative Examples 17 to 24

Respective thin films as shown in Table 6 below were manufactured in the same manner as in Example 29, with the exception that the nanomaterial particle dispersion of Preparation Example 2 was used.

As is apparent from Tables 1 to 6, in Examples 1 to 42, compared to Comparative Examples 1 to 24, the thickness of the coating layer was decreased, light transmittance was increased, and haze and reflectance were decreased. Also, superior pencil hardness and adhesion resulted, and thermal conductivity was increased.

The invention claimed is:
1. An organic-inorganic-hybrid thin film, comprising:
a substrate having an upper surface and a lower surface;
a coating layer formed on either or both of the upper surface and the lower surface of the substrate; and
an adhesive layer formed on a surface of the coating layer opposite to a surface of the coating layer applied on the substrate,
wherein the coating layer comprises an organic-inorganic-hybrid material, the organic-inorganic-hybrid material comprising 50.0 to 70.0 wt % of a hexafunctional acrylate monomer, 15.0 to 30.0 wt % of a trifunctional or tetrafunctional acrylate monomer, 15.0 to 30.0 wt % of an acrylate oligomer, and 14 to 50 wt % of nanomaterial particles or surface-modified nanomaterial particles, wherein the nanomaterial particles or surface-modified nanomaterial particles comprise alumina nanoparticles.
2. The organic-inorganic-hybrid thin film of claim 1, wherein the surface-modified nanomaterial particles are surface modified with a surface-treating agent including at least one selected from among 3-(trimethoxysilyl)propyl

TABLE 6

|  | Coating thick. (μm) | Light transmittance (%) | Haze | Reflectance (%) | Pencil hardness (H) | Adhesion | Thermal conductivity (W/mK) |
|---|---|---|---|---|---|---|---|
| Ex. 29 | 4.1 | 92.5 | 0.9 | 0.91 | 9 | ◎ | 7.6 |
| Ex. 30 | 4.3 | 93.3 | 1.0 | 0.84 | 9 | ◎ | 7.5 |
| Ex. 31 | 4.5 | 93.1 | 0.8 | 0.86 | 9 | ◎ | 7.7 |
| Ex. 32 | 4.4 | 94.4 | 0.9 | 0.83 | 9 | ◎ | 8.2 |
| Ex. 33 | 4.6 | 93.1 | 1.0 | 0.91 | 9 | ◎ | 8.3 |
| Ex. 34 | 4.8 | 94.5 | 0.9 | 0.93 | 9 | ◎ | 7.4 |
| Ex. 35 | 5.1 | 93.4 | 0.8 | 0.82 | 9 | ◎ | 7.6 |
| Ex. 36 | 5.0 | 92.9 | 1.0 | 0.85 | 9 | ◎ | 7.7 |
| Ex. 37 | 4.9 | 94.3 | 1.0 | 0.80 | 9 | ◎ | 7.8 |
| Ex. 38 | 4.8 | 93.5 | 0.9 | 0.85 | 9 | ◎ | 7.3 |
| Ex. 39 | 4.1 | 94.2 | 0.8 | 0.90 | 9 | ◎ | 7.6 |
| Ex. 40 | 4.2 | 94.1 | 1.0 | 0.97 | 9 | ◎ | 8.2 |
| Ex. 41 | 4.3 | 93.8 | 0.9 | 0.92 | 9 | ◎ | 8.3 |
| Ex. 42 | 4.5 | 93.6 | 0.9 | 0.90 | 9 | ◎ | 8.1 |
| C. Ex. 17 | 8.2 | 89.6 | 3.6 | 3.4 | 6 | ◎ | 3.0 |
| C. Ex. 18 | 8.4 | 89.2 | 3.8 | 3.0 | 5 | ○ | 4.1 |
| C. Ex. 19 | 8.1 | 88.4 | 4.2 | 3.1 | 7 | ○ | 4.2 |
| C. Ex. 20 | 8.3 | 87.3 | 5.1 | 3.7 | 7 | ○ | 5.0 |
| C. Ex. 21 | 8.2 | 87.4 | 6.0 | 3.4 | 5 | ○ | 5.1 |
| C. Ex. 22 | 8.3 | 88.2 | 4.8 | 2.2 | 5 | ○ | 6.0 |
| C. Ex. 23 | 8.4 | 87.4 | 4.9 | 2.3 | 6 | ○ | 4.0 |
| C. Ex. 24 | 8.5 | 85.6 | 5.3 | 4.1 | 6 | ○ | 2.9 | vinyl carbamate, 3-(trimethoxysilyl)propyl acrylate, 3-(trimethoxysilyl)propyl methacrylate, and 3-(2,3-epoxypropyloxy)propyl triethoxysilane so as to increase bondability between the surface-modified nanomaterial particles.

3. The organic-inorganic-hybrid thin film of claim 1, wherein the coating layer comprises 80.0 to 99.7 wt % of the organic-inorganic-hybrid material, 0.2 to 5.0 wt % of a photoinitiator, 0.1 to 5 wt % of an additive, and 0.1 to 10 wt % of a leveler.

4. The organic-inorganic-hybrid thin film of claim 1, wherein the coating layer has a film thickness after curing ranging from 1 nm to 300 μm.

5. The organic-inorganic-hybrid thin film of claim 1, wherein the nanomaterial particles or the surface-modified nanomaterial particles of the coating layer have a particle size ranging from 1 nm to 200 nm.

6. The organic-inorganic-hybrid thin film of claim 1, wherein the nanomaterial particles or the surface-modified nanomaterial particles are used in an amount ranging from 20 vol % to less than 30 vol %.

7. The organic-inorganic-hybrid thin film of claim 1, wherein the nanomaterial particles or the surface-modified nanomaterial particles are used in an amount ranging from 30 vol % to 100 vol %.

8. A printed circuit board, comprising the organic-inorganic-hybrid thin film of claim 1.

9. A glass board, comprising the organic-inorganic-hybrid thin film of claim 1.

10. A film or device for a display, comprising the organic-inorganic-hybrid thin film of claim 1.

11. A protective film, comprising the organic-inorganic-hybrid thin film of claim 1.

12. An electronic product, comprising the organic-inorganic-hybrid thin film of claim 1.

13. A plastic board, comprising the organic-inorganic-hybrid thin film of claim 1.

14. An electronic package module, comprising the organic-inorganic-hybrid thin film of claim 1.

15. A product for a car, comprising the organic-inorganic-hybrid thin film of claim 1.

16. A method of manufacturing an organic-inorganic-hybrid thin film of claim 1, comprising:

providing a substrate having an upper surface and a lower surface; forming an adhesive layer on a surface of a coating layer opposite to a surface of the coating layer applied on the substrate; and forming the coating layer including the nanomaterial particles or the surface-modified nanomaterial particles on at least one surface selected from among the upper surface and the lower surface of the substrate; and wherein the coating layer comprises an organic-inorganic-hybrid material, the organic-inorganic-hybrid material, comprising 50.0 to 70.0 wt % of a hexafunctional acrylate monomer, 15.0 to 30.0 wt % of a trifunctional or tetrafunctional acrylate monomer, 15.0 to 30.0 wt % of an acrylate oligomer, and 14 to 50 wt % of nanomaterial particles or surface-modified nanomaterial particles, wherein the nanomaterial particles or surface-modified nanomaterial particles comprise alumina nanoparticles.

17. The method of claim 16, further comprising subjecting the coating layer to chemical etching or plasma etching, after the forming the coating layer.

* * * * *